(12) United States Patent
Vineis et al.

(10) Patent No.: US 8,698,272 B2
(45) Date of Patent: Apr. 15, 2014

(54) SEMICONDUCTOR DEVICES HAVING REDUCED SUBSTRATE DAMAGE AND ASSOCIATED METHODS

(75) Inventors: Christopher Vineis, Watertown, MA (US); James Carey, Waltham, MA (US); Xia Li, Beverly, MA (US)

(73) Assignee: SiOnyx, Inc., Beverly, MA (US)

( * ) Notice: Subject to any disclaimer, the term of this patent is extended or adjusted under 35 U.S.C. 154(b) by 110 days.

(21) Appl. No.: 13/333,482

(22) Filed: Dec. 21, 2011

(65) Prior Publication Data

US 2013/0001553 A1    Jan. 3, 2013

Related U.S. Application Data

(60) Provisional application No. 61/425,634, filed on Dec. 21, 2010.

(51) Int. Cl.
*H01L 31/06* (2012.01)

(52) U.S. Cl.
USPC ..................................... 257/461; 257/E31.13

(58) Field of Classification Search
USPC ...................................... 257/461, 49, E31.13
See application file for complete search history.

(56) References Cited

U.S. PATENT DOCUMENTS

| | | | |
|---|---|---|---|
| 3,487,223 A | 12/1969 | St. John | |
| 4,277,793 A | 7/1981 | Webb | |
| 4,419,533 A | 12/1983 | Czubatyj et al. | |
| 4,493,942 A | 1/1985 | Sheng et al. | |
| 4,514,582 A | 4/1985 | Tiedje et al. | |
| 4,536,608 A | 8/1985 | Sheng et al. | |
| 4,663,188 A | 5/1987 | Kane | |
| 4,829,013 A | 5/1989 | Yamazaki | |
| 5,080,725 A | 1/1992 | Green et al. | |
| 5,081,049 A | 1/1992 | Green et al. | |
| 5,100,478 A | 3/1992 | Kawabata | |
| 5,114,876 A | 5/1992 | Weiner | |
| 5,164,324 A | 11/1992 | Russell et al. | |
| 5,322,988 A | 6/1994 | Russell et al. | |
| 5,346,850 A | 9/1994 | Kaschmitter et al. | |

(Continued)

FOREIGN PATENT DOCUMENTS

| | | |
|---|---|---|
| AU | 3666484 | 6/1985 |
| GB | 2030766 | 4/1980 |

(Continued)

OTHER PUBLICATIONS

Berger, Michael; Moth Eyes Inspire Self-Cleaning Antireflection Nanotechnology Coatings; 2008; 3 pages; Nanowerk LLC.

(Continued)

*Primary Examiner* — Mark Prenty
(74) *Attorney, Agent, or Firm* — Thorpe North & Western LLP (57) ABSTRACT

Optoelectronic devices, materials, and associated methods having increased operating performance are provided. In one aspect, for example, an optoelectronic device can include a semiconductor material, a first doped region in the semiconductor material, a second doped region in the semiconductor material forming a junction with the first doped region, and a laser processed region associated with the junction. The laser processed region is positioned to interact with electromagnetic radiation. Additionally, at least a portion of a region of laser damage from the laser processed region has been removed such that the optoelectronic device has an open circuit voltage of from about 500 mV to about 800 mV.

21 Claims, 3 Drawing Sheets

(56) References Cited

U.S. PATENT DOCUMENTS

| | | |
|---|---|---|
| 5,597,621 A | 1/1997 | Hummel et al. |
| 5,714,404 A | 2/1998 | Mitlitsky et al. |
| 5,731,213 A | 3/1998 | Ono |
| 5,792,280 A | 8/1998 | Ruby et al. |
| 6,147,297 A | 11/2000 | Wettling et al. |
| 6,580,053 B1 | 6/2003 | Voutsas |
| 6,583,936 B1 | 6/2003 | Kaminsky et al. |
| 6,667,528 B2 | 12/2003 | Cohen et al. |
| 6,759,262 B2 | 7/2004 | Theil et al. |
| 6,800,541 B2 | 10/2004 | Okumura |
| 7,057,256 B2 | 6/2006 | Carey, III et al. |
| 7,091,411 B2 | 8/2006 | Falk et al. |
| 7,109,517 B2 | 9/2006 | Zaidi |
| 7,247,527 B2 | 7/2007 | Shimomura et al. |
| 7,314,832 B2 | 1/2008 | Kountz et al. |
| 7,354,792 B2 | 4/2008 | Carey, III et al. |
| 7,390,689 B2 | 6/2008 | Mazur et al. |
| 7,442,629 B2 | 10/2008 | Mazur et al. |
| 7,456,452 B2 | 11/2008 | Wells et al. |
| 7,482,532 B2 | 1/2009 | Yi et al. |
| 7,498,650 B2 | 3/2009 | Lauxtermann |
| 7,504,325 B2 | 3/2009 | Koezuka et al. |
| 7,504,702 B2 | 3/2009 | Mazur et al. |
| 7,511,750 B2 | 3/2009 | Murakami |
| 7,745,901 B1 | 6/2010 | McCaffrey et al. |
| 7,781,856 B2 | 8/2010 | Mazur et al. |
| 7,816,220 B2 | 10/2010 | Mazur et al. |
| 7,847,253 B2 | 12/2010 | Carey et al. |
| 7,884,439 B2 | 2/2011 | Mazur et al. |
| 7,884,446 B2 | 2/2011 | Mazur et al. |
| 8,030,726 B2 | 10/2011 | Sumi |
| 8,058,615 B2 | 11/2011 | McCaffrey et al. |
| 8,207,051 B2 | 6/2012 | Sickler et al. |
| 8,476,681 B2 | 7/2013 | Haddad et al. |
| 2003/0029495 A1 | 2/2003 | Mazur et al. |
| 2004/0222187 A1 | 11/2004 | Lin |
| 2005/0127401 A1 | 6/2005 | Mazur et al. |
| 2005/0227390 A1 | 10/2005 | Shtein et al. |
| 2006/0011955 A1 | 1/2006 | Baggenstoss |
| 2006/0079062 A1 | 4/2006 | Mazur et al. |
| 2006/0118781 A1 | 6/2006 | Rhodes |
| 2006/0180885 A1 | 8/2006 | Rhodes |
| 2006/0231914 A1 | 10/2006 | Carey, III et al. |
| 2007/0145505 A1 | 6/2007 | Kim et al. |
| 2008/0026550 A1 | 1/2008 | Werner et al. |
| 2008/0044943 A1 | 2/2008 | Mazur et al. |
| 2008/0076240 A1 | 3/2008 | Veschetti et al. |
| 2008/0099804 A1 | 5/2008 | Venezia et al. |
| 2008/0178932 A1 | 7/2008 | Den Boer et al. |
| 2008/0258604 A1 | 10/2008 | Mazur et al. |
| 2009/0065051 A1 | 3/2009 | Chan et al. |
| 2009/0142879 A1 | 6/2009 | Isaka et al. |
| 2009/0160983 A1 | 6/2009 | Lenchenkov |
| 2009/0194671 A1 | 8/2009 | Nozaki et al. |
| 2009/0200586 A1 | 8/2009 | Mao et al. |
| 2009/0213883 A1 | 8/2009 | Mazur et al. |
| 2010/0037952 A1 | 2/2010 | Lin |
| 2010/0052088 A1 | 3/2010 | Carey |
| 2010/0055887 A1 | 3/2010 | Piwczyk |
| 2010/0072349 A1 | 3/2010 | Veeder |
| 2010/0074396 A1 | 3/2010 | Schmand et al. |
| 2010/0143744 A1 | 6/2010 | Gupta |
| 2010/0219506 A1 | 9/2010 | Gupta |
| 2010/0224229 A1 | 9/2010 | Pralle et al. |
| 2010/0240169 A1 | 9/2010 | Petti et al. |
| 2010/0264473 A1 | 10/2010 | Adkisson et al. |
| 2010/0290668 A1 | 11/2010 | Friedman et al. |
| 2010/0300505 A1 | 12/2010 | Chen |
| 2011/0073976 A1 | 3/2011 | Vaillant |
| 2011/0220971 A1 | 9/2011 | Haddad |
| 2011/0227138 A1 | 9/2011 | Haddad |
| 2011/0266644 A1 | 11/2011 | Yamamura et al. |
| 2011/0303999 A1 | 12/2011 | Sakamoto et al. |
| 2012/0024363 A1 | 2/2012 | Dimer et al. |
| 2012/0024364 A1 | 2/2012 | Carey, III et al. |
| 2012/0111396 A1* | 5/2012 | Saylor et al. ............... 136/255 |
| 2012/0171804 A1 | 7/2012 | Moslehi et al. |
| 2012/0313204 A1 | 12/2012 | Haddad et al. |
| 2012/0313205 A1 | 12/2012 | Haddad et al. |

FOREIGN PATENT DOCUMENTS

| | | |
|---|---|---|
| JP | 63116421 | 5/1988 |
| JP | 2152226 | 6/1990 |
| JP | 07/173484 | 7/1995 |
| JP | 9298308 | 11/1997 |
| JP | 2008/187003 | 8/2008 |
| KR | 2001/0061058 | 4/2001 |
| KR | 2010/0118864 | 11/2010 |
| WO | WO 2006/086014 | 8/2006 |
| WO | WO 2009/100023 | 8/2009 |
| WO | WO 2011/035188 | 3/2011 |

OTHER PUBLICATIONS

Boden, S.A. et al.; Nanoimprinting for Antireflective Moth-Eye Surfaces; 4 pages; 2008.

Carey et al., "Femtosecond-Laser-Assisted Microstructuring of Silicon Surfaces", Optics and Photonics News, 2003. 14, 32-36.

Carey, et al. "Femtosecond Laser-Assisted Microstructuring of Silicon for Novel Detector, Sensing and Display Technologies", LEOS 2003, 481-482, Tuscon, AR.

Carey, et al. "Femtosecond Laser-Assisted Microstructuring of Silicon for Novel Detector, Sensing and Display Technologies", LEOS; 2002, 97-98, Glasgos, Scotland, 2002.

Carey, et al., "Fabrication of Micrometer-Sized Conical Field Emitters Using Femtosecond Laser-Assisted Etching of Silicon," Proc. IVMC 2001, 75-76, UC Davis, Davis, CA.

Carey, et al., "Field Emission from Silicon. Microstructures Formed by Femtosecond Laser Assisted Etching," Proc. CLEO 2001 (Baltimore, MD 2001) 555-557.

Carey, et al., "High Sensitivity Silicon-Based VIS/NIR Photodetectors", Optical Society of America (2003) 1-2.

Carey, III; "Femtosecond-laser Microstructuring of Silicon for Novel Optoelectronic Devices"; Harvard University, Jul. 2004; (Thesis).

Chen, Q. et al.; Broadband moth-eye antireflection coatings fabricated by low-cost nanoimprinting; Applied Physics Letters 94; pp. 263118-1-263118-3; 2009; American Institute of Physics.

Chien et al, "Pulse Width Effect in Ultrafast Laser Processing of Materials," Applied Physics A, 2005, 1257-1263, 81, Springer Berlin, Heidelberg, Germany.

Crouch et al., "Comparison of Structure and Properties of Femtosecond and Nanosecond Laser-Structured Silicon" Appl. Phys. Lett., 2004, 84,1850-1852.

Crouch et al., "Infrared Absorption by Sulfur-Doped Silicon Formed by Femtosecond Laser Irradiation", Appl. Phys. A, 2004, 79, 1635-1641.

Dewan, Rahul et al.; Light Trapping in Thin-Film Silicon Solar Cells with Submicron Surface Texture; Optics Express; vol. 17, No. 25; Dec. 7, 2009; Optical Society of America.

Dobrzanski, L.A. et al.; Laser Surface Treatment of Multicrystalline Silicon for Enhancing Optical Properties; Journal of Materials Processing Technology; p. 291-296; 2007; Elsevier B.V.

Forbes; "Texturing, reflectivity, diffuse scattering and light trapping in silicon solar cells"; 2012.

Haug, et al.; "Light Trapping effects in thin film silicon solar cells"; 2009.

Her et al., "Microstructuring of Silicon with Femtosecond Laser Pulses," Applied Physics Letters, 1998, 1673-1675, vol. 73, No. 12, American Institute of Physics.

Her et al., "Novel Conical Microstructures Created in Silicon With Femtosecond Laser Pulses", CLEO 1998, 511-512, San Francisco, CA.

Her, et al., "Femtosecond laser-induced formation of spikes on silicon," Applied Physics A, 2000, 70, 383-385.

Hermann, S. et al.; Impact of Surface Topography and Laser Pulse Duration for Laser Ablation of Solar Cell Front Side Passivating SiNx Layers; Journal of Applied Physics; vol. 108, No. 11; pp. 114514-1-114514-8; 2010; American Institute of Physics.

(56) References Cited

OTHER PUBLICATIONS

Huang, et al.; "Microstructured silicon photodetector"; Applied Physics Letters 89, 033506; 2006 American Institute of Physics; 2000.

Hüpkes, J. et al.; Light Scattering and Trapping in Different Thin Film Photovoltaic Devices; 24$^{th}$ European Photovoltaic Solar Energy Conference, Hamburg, Germany (Sep. 21-25, 2009); pp. 2766-2769.

Kim et al.; "Strong Sub-Band-Gap Infrared Absorption in Silicon Supersaturated with Sulfur"; 2006 Appl. Phys. Lett. 88, 241902-1-241902-3.

Madzhaov, et al.; "Light trapping in thin-firm silicon solar cells for superstrate and substrate configuration" Abstract #1614, 218$^{th}$ ECS Meeting © 2010 the Electrochemical Society.

Moloney, A.M. et al.; Novel Black Silicon Pin Photodiodes; 8 pages; Jan. 25, 2006; SPIE.

Nayak, B.K. et al.; Ultrafast Laser Textured Silicon Solar Cells; Mater. Res. Soc. Symp. Proc.; vol. 1123; 6 pages; 2009; Materials Research Society.

Nayak, et al.; "Efficient light trapping in silicon solar cells by ultrafast-laser-induced self-assembled micro/nano structures"; Progress in Photovoltaics: Research and Applications; 2011.

Pain, Bedabrata; "A Back-Illuminated Megapixel CMOS Image Sensor"; http://hdl.handle.net/2014/39312; May 1, 2005.

Pedraza et al., "Surface Nanostructuring of Silicon", Appl. Phys. A, 2003, 77, 277-284.

Russell, et al.; "Nanosecond Eximer Laser Processing for Novel Microelectronic Fabrication"; Nanosecond Excimer Laser Processing; 6 pages; 1989.

Sarnet et al.; "Femtosecond laser for black silicon and photovoltaic cells"; Feb. 21, 2008, Proc. Of SPIE; vol. 6881; pp. 1-15.

Shen et al., "Formation of Regular Arrays of Silicon Micorspikes by Femotsecond Laser Irradiation Through A Mask", Appl. Phys. Lett., 82, 1715-1717 (2003).

Tabbal et al., "Formation of Single Crystal Sulfur Supersaturated Silicon Based Junctions by Pulsed Laser Melting". 2007, J. Vac. Sci. Technol. B25(6), 1847-1852.

Tull; "Femtosecond Laser Ablation of Silicon: Nanoparticles, Doping and Photovotaics"; Harvard University, Jun. 2007 (Thesis).

Wu et al., "Black Silicon: A New Light Absorber," APS Centennial Meeting (Mar. 23, 1999).

Wu et al., "Femtosecond laser-gas-solid interactions," Thesis presented to the Department of Physics at Harvard University, pp. 1-113, 126-136, Aug. 2000.

Wu et al., "Visible Luminescence From Silicon Surfaces Microstructured in Air". Appl. Phys. Lett., vol. 81, No. 11, 1999-2001 (2002).

Wu, et al, "Near-Unity Below-Band-Gap Absorption by Microstructured Silicon," 2001, Applied Physics Letters, 1850-1852, vol. 78, No. 13, American Institute of Physics.

Yamamoto, K. et al.; NIR Sensitivity Enhancement by Laser Treatment for Si Detectors; Nuclear Instruments and Methods in Physics Research A; pp. 520-523; Mar. 31, 2010; Elsevier.

Younkin et al., "Infrared Absorption by Conical Silicon Microstructures Made in a Variety of Background Gases Using Femtosecond-Laser Pulses", J. Appl. Phys., 93, 2626-2629 (2003).

Younkin, "Surface Studies and Microstructure Fabrication Using Femtosecond Laser Pulses," Thesis presented to the Division of Engineering & Applied sciences at Harvard University (Aug. 2001).

Yuan, et al.; "Efficient black silicon solar cell with a density-graded nanoporous surface: Optical properties, performance limitations, and design rules"; American Institute of Physics; Applied Physics Letters 95. 1230501 (2009) 3 pages.

PCT/US2011/066602; filed Dec. 21, 2011; SiOnyx, Inc. et al.; international search report dated Sep. 7, 2012.

* cited by examiner

SEMICONDUCTOR DEVICES HAVING REDUCED SUBSTRATE DAMAGE AND ASSOCIATED METHODS

PRIORITY DATA

This application claims the benefit of U.S. Provisional Patent Application Ser. No. 61/425,634, filed on Dec. 21, 2010, which is incorporated herein by reference.

BACKGROUND

The interaction of light with semiconductor devices is at the core of some important innovations. Optoelectronic devices, such as photovoltaics, photodiodes, and imagers, are used in various technologies, such as for example, solar cells, digital cameras, optical mice, video cameras, cell phones, and the like. Typically, many semiconductor photodetecting devices are formed from a silicon material. When thick enough, silicon is known to absorb a majority of incident visible light having wavelengths in the range of about 300 nm to 900 nm. These factors, combined with its low cost, abundant supply, non-toxicity and the quantum efficiency in the visible spectrum make silicon a top choice for light detecting. However, because of its indirect bandgap, one major limitation to silicon for optical detectors or optical/electrical energy converters is a typical requirement for a relatively thick device layer (typically >100 microns for common devices) to achieve sufficient optical absorption.

SUMMARY

The present disclosure provides optoelectronic devices, materials, and associated methods having increased operating performance. In one aspect, for example, an optoelectronic device is provided. Such a device can include a semiconductor material, a first doped region in the semiconductor material, a second doped region in the semiconductor material forming a junction with the first doped region, and a laser processed region associated with the junction. The laser processed region is positioned to interact with electromagnetic radiation. Additionally, at least a portion of a region of laser damage from the laser processed region has been removed such that the optoelectronic device has an open circuit voltage of from about 500 mV to about 800 mV. In another aspect, laser damage from the laser processed region has been removed such that the optoelectronic device has an open circuit voltage of from about 600 mV to about 700 mV.

In another aspect, a method of forming an optoelectronic device is provided. Such a method can include forming a first doped region in a semiconductor material, forming a second doped region in the semiconductor material such that the first doped region and the second doped region form a junction, and laser processing a target region of the semiconductor material to form a laser textured region associated with the junction where the laser textured region is positioned to interact with electromagnetic radiation. The method also includes removing at least a portion of a laser damaged region of the laser textured region while substantially maintaining surface topology of the laser textured region such that the optoelectronic device has an open circuit voltage of from about 500 mV to about 800 mV. In another aspect, sufficient laser damage from the laser damaged region has been removed such that the optoelectronic device has an open circuit voltage of from about 600 mV to about 700 mV.

In yet another aspect, a semiconductor material is provided. Such a semiconductor material can include a first region disposed adjacent to a second region, wherein the first region has a thickness in the range of about 100 nm to about 5 microns and includes a laser processed region that has undergone a laser damage removal process, and wherein the majority-carrier mobility and minority-carrier lifetime of the first region are at least about 50% the value of the second region, and wherein the first region and the second region have substantially the same doping levels.

BRIEF DESCRIPTION OF THE DRAWINGS

For a fuller understanding of the nature and advantage of the present disclosure, reference is being made to the following detailed description of various embodiments and in connection with the accompanying drawings, in which.

DETAILED DESCRIPTION

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

DEFINITIONS

The following terminology will be used in accordance with the definitions set forth below.

It should be noted that, as used in this specification and the appended claims, the singular forms "a," and, "the" include plural referents unless the context clearly dictates otherwise. Thus, for example, reference to "a dopant" includes one or more of such dopants and reference to "the layer" includes reference to one or more of such layers.

As used herein, the terms "light" and "electromagnetic radiation" can be used interchangeably and can refer to light or electromagnetic radiation in the ultraviolet, visible, near infrared, and infrared spectra. The terms can further more broadly include electromagnetic radiation such as radio waves, microwaves, x-rays, and gamma rays. Thus, the term "light" is not limited to electromagnetic radiation in the visible spectrum.

As used herein, the term "laser processing" refers to the modification of a region of a region of a semiconductor material using a short-pulsed laser to form a textured region or surface.

As used herein, the terms "surface modifying" and "surface modification" refer to the altering of a surface of a semiconductor material using a laser processing technique. In one specific aspect, surface modification can include processes using primarily laser radiation. In another aspect, surface modification can include processes using laser radiation in combination with a dopant, whereby the laser radiation facilitates the incorporation of the dopant into a surface of the semiconductor material. Also, a modified surface can include, for example, a textured surface.

As used herein, the term "textured surface" can refer to a surface having a topology with nanometer to micrometer-sized surface variations formed by irradiation with laser pulses.

As used herein, the term "fluence" refers to the amount of energy from a single pulse of laser radiation that passes through a unit area. In other words, "fluence" can be described as the energy density of one laser pulse.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

THE DISCLOSURE

The present disclosure relates to optoelectronic devices, materials, and associated methods. Such devices exhibit increased electromagnetic radiation absorption properties and/or enhanced anti-reflecting properties, while at the same time having reduced semiconductor material imperfections or defects that can result from the manufacturing process. It has been discovered that the inclusion of a specialized region of a semiconductor material, such as a laser processed region, can facilitate a more efficient interaction between the semiconductor device and electromagnetic radiation. For example, a laser processed region, such as a region of the semiconductor material that has been textured or surface modified by a pulsed laser, can increase the efficiency of light interaction by many optoelectronic devices. Such a region can exhibit a variety of beneficial properties depending on the design of the device, such as for example, enhanced absorption properties, enhanced anti-reflective properties, and the like.

In some cases, however, such a laser texturing process can introduce laser damage into the semiconductor material as the laser is ablating, melting, and allowing the semiconductor to solidify. Laser damage can have detrimental effects on the semiconductor material, such as, for example, lower minority-carrier lifetime and lower majority-carrier mobility. In turn these effects can result in lower open-circuit voltage and/or lower short-circuit current density. For many optoelectronic devices, this laser damage to the crystalline structure of the semiconductor can result in increased dark current and/or reduced quantum efficiency and device performance. Accordingly, by removing a portion, substantially all, or all of the laser damage introduced as a result of laser texturing a semiconductor surface, the open circuit voltage ($V_{oc}$) of the laser textured region can be increased, in some cases to near bulk semiconductor or doped semiconductor levels.

Figure 1:
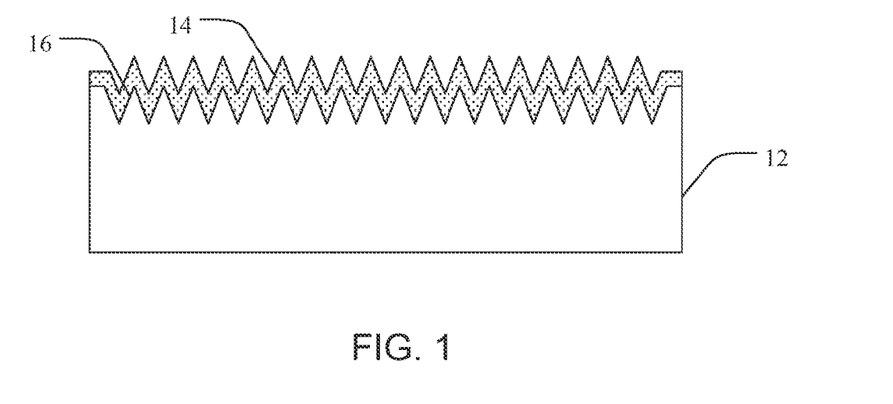
FIG. 1 is a cross-sectional side view of an optoelectronic device in accordance with one aspect of the present disclosure.
Figure 2:
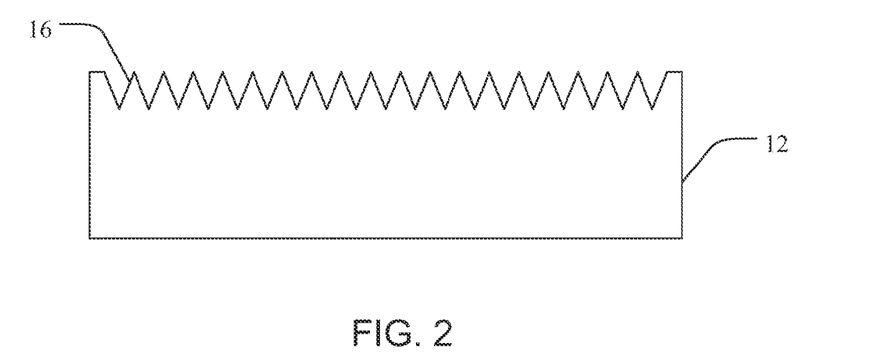
FIG. 2 is a cross-sectional side view of an optoelectronic device in accordance with another aspect of the present disclosure.

For example, as is shown in FIG. 1, a semiconductor material 12 can be laser processed to produce a textured surface 16. The textured surface can include a laser damaged region 14, where the laser processing has generated undesirable defects in the crystal lattice of the semiconductor material that can result in lower minority-carrier lifetime and lower majority-carrier mobility. Examples of such defects can include, without limitation, grain boundaries, dangling bonds, stacking faults, amorphous (non-crystalline) regions, point defects such as vacancies or interstitials, and other crystalline defects known to those skilled in the art. At least a portion of this laser damage can be removed as is shown in FIG. 2, where at least a portion of the underlying laser texturing 16 remains on the semiconductor material 12. Thus by removing such laser damage, the benefits of the textured surface can be maintained while decreasing defects caused by the laser production of that surface.

The amount of material removed to decrease the laser damage in the semiconductor material can vary depending on the degree and extent of damage in the material, the characteristics of the material, the desired functionality of the resulting device, and the like. As such, the present scope includes any degree of damage removal that maintains at least a portion of the laser processed surface in the semiconductor material. In one aspect for example, the thickness of the material having laser damage that is removed can be from about 1 nm to about 3 μm. In another aspect, the thickness of the material having laser damage that is removed can be from about 50 nm to about 2 µm. In another aspect, the thickness of the material having laser damage that is removed can be from about 50 nm to about 1 µm. In yet another aspect, the thickness or amount of damaged material removed is sufficient to achieve a desired efficiency in an optoelectronic device. In a further aspect, the thickness or amount of damaged material removed is sufficient such that the open circuit voltage in the textured region is substantially the same as the open circuit voltage in the bulk semiconductor material, or in a doped region of the bulk semiconductor material.

Figure 3:
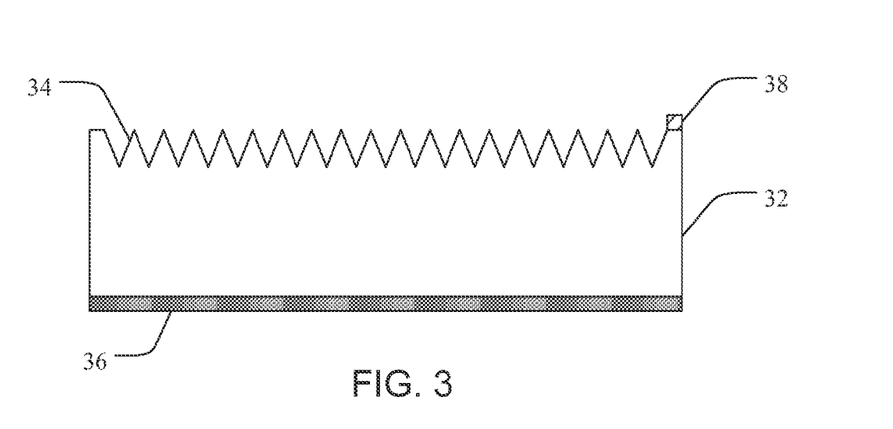
FIG. 3 is a cross-sectional side view of an optoelectronic device in accordance with another aspect of the present disclosure.

Various optoelectronic devices are contemplated, and any such device that can benefit from aspects of the present disclosure are considered to be within the present scope. For example, FIG. 3 shows one aspect whereby an electromagnetic radiation absorbing semiconductor material 32 has been laser processed to form a textured region having surface features 34. The textured region has been processed to remove laser induced substrate defects. Electrical contacts 36 and 38 can be disposed on the back side and front side, respectively. In one aspect, electrical contact 36 can also serve as a reflecting layer. In another aspect, a separate reflecting layer can be coupled between the semiconductor material and the electrical contact (not shown).

It should be noted that the configuration of the devices shown in the figures is merely exemplary, and various other configurations are contemplated. For example, the device shown in FIG. 3 receives light through the textured region and into the semiconductor material. In an alternative aspect, the backside of the semiconductor material can be textured, leaving the front side untextured. In this way, light impinges on and passes through the semiconductor material before striking the textured layer. The textured layer then can direct the light back through the semiconductor material, thus increasing the efficiency of the device. In yet another aspect, both the front side and the backside of the semiconductor material can be textured.

In another aspect, an optoelectronic device can include a semiconductor material, a first doped region in the semiconductor material, and a second doped region in the semiconductor material forming a junction with the first doped region. The device can further include a laser processed region associated with the junction and configured to interact with electromagnetic radiation. Additionally, at least a portion of a region of laser damage from the laser processed region has been removed such that the optoelectronic device has an open circuit voltage of from about 500 mV to about 800 mV. In another aspect, laser damage from the laser processed region has been removed such that the optoelectronic device has an open circuit voltage of from about 600 mV to about 700 mV. Such a laser processing/damage removal process can additionally facilitate an increase in quantum efficiency. In one aspect, for example, the optoelectronic device has an internal quantum efficiency of from about 50% to about 100% for an electromagnetic radiation wavelength of 300 nm. In another aspect, the optoelectronic device has an internal quantum efficiency of from about 70% to about 100% for an electromagnetic radiation wavelength of 400 nm.

Figure 4:
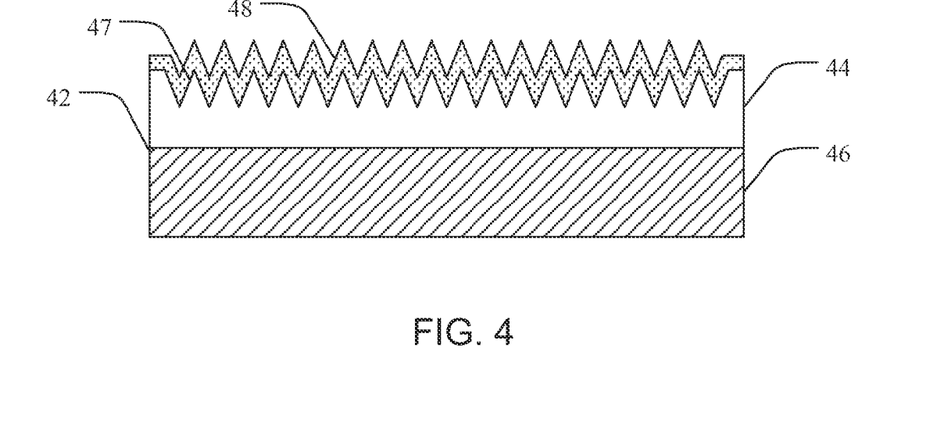
FIG. 4 is a cross-sectional side view of an optoelectronic device in accordance with another aspect of the present disclosure.

FIG. 4 shows another aspect of an optoelectronic device having a semiconductor material 42 and a first doped region 44 and a second doped region 46 that form a junction. The semiconductor material can have a range of doping levels from non-intentionally doped to highly doped levels, including hyper-doped exceeding the solid solubility limit. For example, in the case of silicon these levels could result in carrier concentrations ranging from $1 \times 10^{12}/cm^3$ to about $1 \times 10^{20}/cm^3$. The first doped region in FIG. 4 includes a laser processed region including surface features 47 and an associated laser damaged region 48 that was created by the pulsed laser during the formation of the surface features. In this case, the laser processed region is formed on the first doped region. As such, doping can be applied concurrently with the laser processing or as a separate process. In another aspect, the laser processed region can be formed adjacent to the first doped region, either as a separate material or as a distinct portion of the first doped region. In yet another aspect, a dielectric material can be disposed on the first doped region, and this dielectric material can be laser processed to form the textured region. In this case, the textured region can be electrically isolated from the first doped region.

Figure 5:
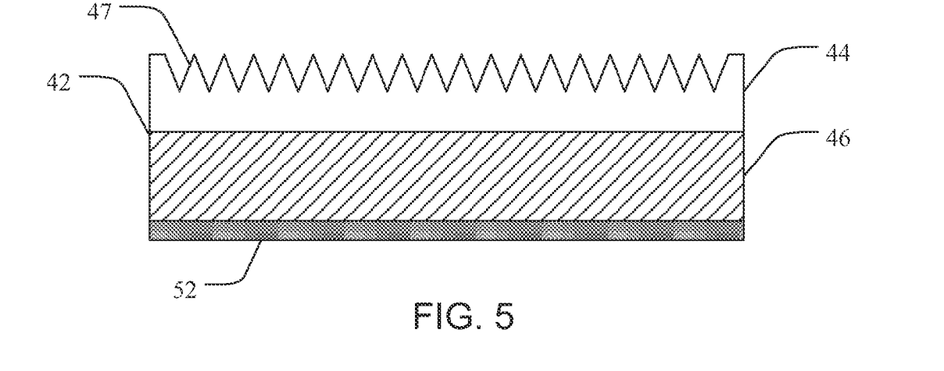
FIG. 5 is a cross-sectional side view of an optoelectronic device in accordance with another aspect of the present disclosure.

Removing at least a portion of this laser damaged region, as is shown in FIG. 5, can increase the minority-carrier lifetime and the majority-carrier mobility of the material, thus increasing the open circuit voltage. In addition to those structures shown in FIG. 4, FIG. 5 also shows a reflective layer 52 coupled to the back surface of the device in order to reflect and redirect light back through the device. The aspects in FIGS. 4 and 5 can also include electrical contacts as needed (not shown).

Figure 6:
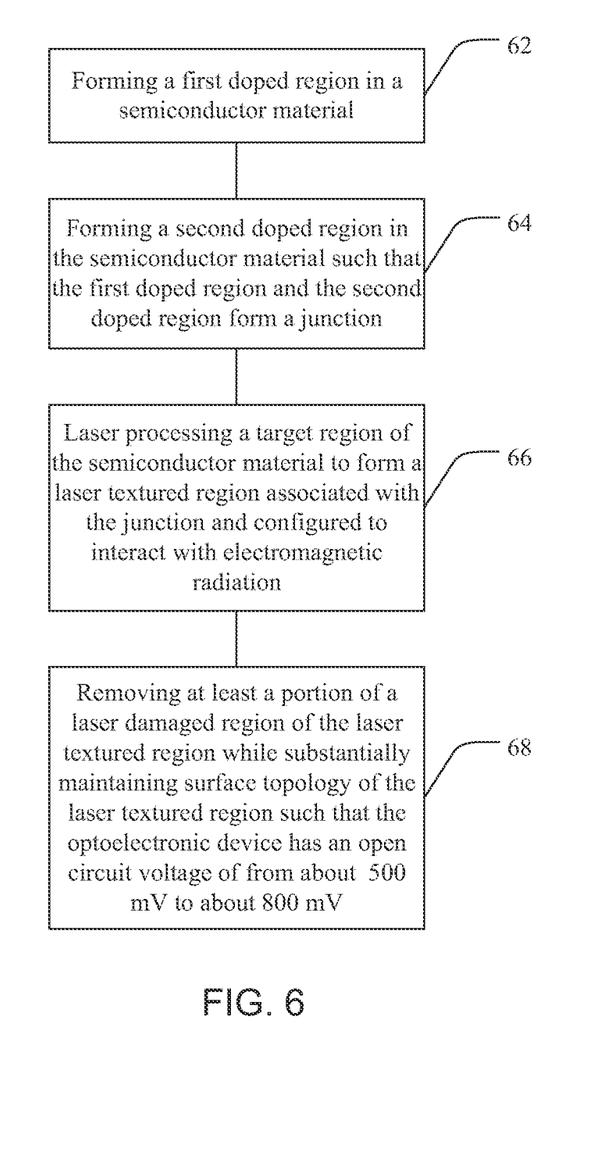
FIG. 6 is a flow diagram of a method for making an optoelectronic device in accordance with another aspect of the present disclosure.

Additionally, as is shown in FIG. 6, a method is provided for forming an optoelectronic device. Such a method can include forming a first doped region in a semiconductor material 62, forming a second doped region in the semiconductor material such that the first doped region and the second doped region form a junction 64, laser processing a target region of the semiconductor material to form a laser textured region associated with the junction and configured to interact with electromagnetic radiation 66, and removing at least a portion of a laser damaged region of the laser textured region while substantially maintaining surface topology of the laser textured region such that the optoelectronic device has an open circuit voltage of from about 500 mV to about 800 mV 68. In another aspect, at least 50% of the surface topology is maintained after damage removal. In other words, the peak to valley height and/or the RMS roughness of the surface after the laser damage removal are within 50% of the surface before the laser damage removal step. In yet another aspect, at least 75% of the surface topology is maintained after damage removal. In a further aspect, at least 90% of the surface topology is maintained after damage removal. In yet a further aspect, at least 95% of the surface topology is maintained after damage removal.

The present disclosure additionally provides semiconductor materials that can be utilized in various optoelectronic devices. For example, in one aspect such a semiconductor material can include a first region disposed adjacent to a second region, wherein the first region has a thickness in the range of about 100 nm to about 5 microns and includes a laser processed region that has undergone a laser damage removal process, and wherein the majority-carrier mobility and minority-carrier lifetime of the first region are at least about 50% the value of the second region, and wherein the first region and the second region have substantially the same doping levels.

A variety of semiconductor materials are contemplated for use with the devices and methods according to aspects of the present disclosure. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon.

Exemplary combinations of group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof.

Exemplary combinations of group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, AlxGal-xAs), indium gallium arsenide (InGaAs, InxGal-xAs), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP), and combinations thereof.

In one specific aspect, the semiconductor material can include at least one of Si, GaAs, Ge, CIGS, CdTe, including alloys and combinations thereof. In another specific aspect, the semiconductor can be or include Si.

Various types of semiconductor materials are contemplated, and any such material that can be incorporated into an optoelectronic device is considered to be within the present scope. In one aspect, for example, the semiconductor material is monocrystalline. In another aspect, the semiconductor material is multicrystalline. In yet another aspect, the semiconductor material is microcrystalline. It is also contemplated that the semiconductor material can be amorphous.

The semiconductor materials can be of any thickness that allows optoelectronic functionality to a given device, and thus any such thickness of semiconductor material is considered to be within the present scope. In some aspects a textured region increases the efficiency of the device such that the semiconductor materials can be thinner than has previously been possible. Decreasing the thickness of the semiconductor materials reduces the amount of semiconductor material required to make such a device. In one aspect, for example, the semiconductor substrate has a thickness of from about 500 nm to about 200 µm. In another aspect, the semiconductor substrate has a thickness of less than or equal to about 100 µm. In yet another aspect, the semiconductor substrate has a thickness of from about 1 µm to about 50 µm. In a further aspect, the semiconductor substrate can have a thickness of from about 1 µm to about 5 µm. In yet a further aspect, the semiconductor substrate can have a thickness of from about 500 nm to about 2 µm. It should be noted that, while thinner semiconductor materials are exemplified, semiconductor materials of any thickness are considered to be within the present scope.

A variety of dopant materials are contemplated, and any such material that can be used to create a doped region of the semiconductor material is considered to be within the present scope. It should be noted that the particular dopant utilized can vary depending on the semiconductor material being used, as well as the intended use of the resulting semiconductor material. For example, the selection of potential dopants may differ depending on whether or not tuning of a photosensitive device is desired.

A dopant can be either electron donating or hole donating. In one aspect, non-limiting examples of dopant materials can include S, F, B, P, N, As, Se, Te, Ge, Ar, Ga, In, Sb, and combinations thereof. It should be noted that the scope of dopant materials should include, not only the dopant materials themselves, but also materials in forms that deliver such dopants (i.e. dopant carriers). For example, S dopant materials includes not only S, but also any material capable being used to dope S into the target region, such as, for example, $H_2S$, $SF_6$, $SO_2$, and the like, including combinations thereof. In one specific aspect, the dopant can be S. Sulfur can be present at an ion dosage level of from about $5 \times 10^{14}$ to about $3 \times 10^{20}$ ions/cm$^2$. Non-limiting examples of fluorine-containing compounds can include $ClF_3$, $PF_5$, $F_2$ $SF_6$, $BF_3$, $GeF_4$, $WF_6$, $SiF_4$, HF, $CF_4$, $CHF_3$, $CH_2F_2$, $CH_3F$, $C_2F_6$, $C_2HF_5$, $C_3F_8$, $C_4F_8$, $NF_3$, and the like, including combinations thereof. Non-limiting examples of boron-containing compounds can include $B(CH_3)_3$, $BF_3$, $BCl_3$, BN, $C_2B_{10}H_{12}$, borosilica, $B_2H_6$, and the like, including combinations thereof. Non-limiting examples of phosphorous-containing compounds can include $PF_5$, $PH_3$, $POCl_3$, $P_2O_5$, and the like, including combinations thereof. Non-limiting examples of chlorine-containing compounds can include $Cl_2$, $SiH_2Cl_2$, HCl, $SiCl_4$, and the like, including combinations thereof. Dopants can also include arsenic-containing compounds such as $AsH_3$ and the like, as well as antimony-containing compounds. Additionally, dopant materials can include mixtures or combinations across dopant groups, i.e. a sulfur-containing compound mixed with a chlorine-containing compound. In one aspect, the dopant material can have a density that is greater than air. In one specific aspect, the dopant material can include Se, $H_2S$, $SF_6$, or mixtures thereof. In yet another specific aspect, the dopant can be $SF_6$ and can have a predetermined concentration range of about $5.0 \times 10^{-8}$ mol/cm$^3$ to about $5.0 \times 10^{-4}$ mol/cm$^3$. $SF_6$ gas is a good carrier for the incorporation of sulfur into the semiconductor material via a laser process, for example, without significant adverse effects on the semiconductor material. Additionally, it is noted that dopants can also be liquid solutions of n-type or p-type dopant materials dissolved in a solution such as water, alcohol, or an acid or basic solution. Dopants can also be solid materials applied as a powder or as a suspension dried onto the wafer. Additionally, dopants can be introduced into the semiconductor by any of various methods such as ion doping, diffusion doping, plasma deposition, sputtering, laser doping, and so forth.

Furthermore, the semiconductor material according to aspects of the present disclosure can comprise multiple layers or regions. In some aspects, layers can vary in majority carrier polarity (i.e. donor or acceptor impurities). The donor or acceptor impurities are typically determined by the type of dopant/impurities introduced into the device either through a growth process, deposition process, epitaxial process, implant process, lasing process or other known process to those skilled in the art. In some aspects such semiconductor materials can include an n-type layer, an intrinsic (i-type) layer, and a p-type layer, thus forming a p-i-n semiconductor material stack that creates a junction and/or depletion region. A semiconductor material devoid of an i-type layer is also contemplated in accordance with the present disclosure. In other aspects the semiconductor material may include multiple junctions. Additionally, in some aspects, variations of n(--), n(-), n(+), n(++), p(--), p(-), p(+), or p(++) type semiconductor layers can be used. The minus and positive signs are indicators of the relative magnitude of the doping of the semiconductor material.

As has been described, at least a portion of a semiconductor material can be laser processed to form a textured region for interacting with electromagnetic radiation. A textured region can be formed at any location in or on the semiconductor material, and particularly at locations that provide enhanced functionality of the optoelectronic device. For example, in one aspect the textured region can be formed at a light interacting region. A light interacting region can be defined as a region of the semiconductor material that interacts with light during the functioning of the device. In one aspect, for example, a light interacting region can be the frontside surface of the semiconductor material that receives incident electromagnetic radiation. In another aspect, a light interacting region can be the backside of the semiconductor material that interacts with electromagnetic radiation that has passed through the semiconductor material. In yet another aspect, a light interacting region can be a side region of the semiconductor material that receives reflected electromagnetic radiation. The textured region can be formed at one or more light interacting regions, and the textured region can be formed across the entire region or only a portion thereof, depending on the design of the device. In one aspect, for example, the textured region is formed across at least 50% of the area of a given light interacting region. In another aspect, the textured region is formed across at least 75% of the area of a given light interacting region. In another aspect, the textured region is formed across at least 80% of the area of a given light interacting region. In yet another aspect, the textured region is formed across at least 90% of the area of a given light interacting region. In other aspects, discrete locations of the light interacting region can be textured.

The textured region can function to scatter electromagnetic radiation, to redirect electromagnetic radiation, and/or to absorb electromagnetic radiation, thus increasing the quantum efficiency of the device. In one aspect, electromagnetic radiation contacts a particular textured region prior to entering the semiconductor material. In another aspect, electromagnetic radiation passes through the semiconductor material prior to contacting a particular textured region. The textured region can include surface features to increase the effective absorption length of the photovoltaic solar cell. As such, in some aspects textured regions can allow an optoelectronic device to experience multiple passes of electromagnetic radiation within the device, particularly at longer wavelengths (i.e. infrared). Such internal reflection can thus increase the effective absorption length to be greater than the physical thickness of the semiconductor material. This increase in absorption length in turn increases the quantum efficiency of the device. Additionally, in one aspect, the textured region on the front side of the semiconductor material is anti-reflective, and can thus reduce reflection of the light impinging thereon. Such reduced reflection can further increase the proportion of light entering into the semiconductor material. Thus, an anti-reflective surface can increase the efficiency of the device by decreasing light loss that can result due to reflection.

A variety of techniques of laser processing to form a textured region are contemplated, and any technique capable of forming such a region is considered to be within the present scope. Laser treatment or processing can allow for, among other things, enhanced absorption properties and thus increased electromagnetic radiation focusing and detection. In one aspect, for example, a target region of the semiconductor material can be irradiated with pulsed laser radiation to form a textured region. Examples of such processing have been described in further detail in U.S. Pat. Nos. 7,057,256, 7,354,792 and 7,442,629, which are incorporated herein by reference in their entireties. Briefly, a surface of a semiconductor material is irradiated with laser radiation to form a textured or surface modified region. Such laser processing can occur with or without a dopant material. In those aspects whereby a dopant is used, the laser can be directed through a dopant carrier and onto the semiconductor material. In this way, dopant from the dopant carrier is introduced into the target region of the semiconductor material. Such a region incorporated into a semiconductor material can have various benefits in accordance with aspects of the present disclosure. For example, the textured region typically has surface features and/or a textured layer that increases the surface area of the laser treated region, thereby increasing the probability of electromagnetic radiation absorption. In one aspect, such a textured region is a substantially textured surface including micron-sized and/or nano-sized surface features that have been generated by the laser texturing. In another aspect, irradiating the semiconductor material includes exposing the laser radiation to a dopant such that irradiation incorporates the dopant into the semiconductor. Various dopant materials are known in the art, and are discussed in more detail herein.

As such, the region of the semiconductor material is chemically and/or structurally altered by the laser treatment, which may, in some aspects, result in the formation of surface features appearing as microstructures, nanostructures, and/or patterned areas on the surface and, if a dopant is used, the incorporation of such dopants into the semiconductor material. The surface features can have a variety of configurations depending on the laser processing conditions used to form the textured region. The surface features can be, without limitation, cones, pyramids, pillars, protrusions, microlenses, sphere-like structures, quantum dots, inverted features, and the like, including combinations thereof. Additionally, the surface features can be micron-sized, nano-sized, or a combination thereof. For example, cones, pyramids, protrusions, and the like can have an average height within this range. In one aspect, the average height would be from the base of the feature to the distal tip of the feature. In another aspect, the average height would be from the surface plane upon which the feature was created to the distal tips of the feature. As another example, quantum dots, microlenses, and the like can have an average diameter within the micron-sized and/or nano-sized range.

In some aspects, the features can be on the order of 50 nm to 2 µm in size and can assist in the absorption of electromagnetic radiation. In other words, the textured surface can increase the probability of incident radiation being absorbed by the semiconductor material. In another aspect, the features can be on the order of 50 nm to 20 µm in size. In yet another aspect, the features can be on the order of 5 nm to 10 µm in size. It should be noted that these sizes represent the sizes of the surface features after the removal of the laser damaged region of the semiconductor material.

The type of laser radiation used to surface modify a semiconductor material can vary depending on the material and the intended modification. Any laser radiation known in the art can be used with the devices and methods of the present disclosure. There are a number of laser characteristics, however, that can affect the surface modification process and/or the resulting product including, but not limited to the wavelength of the laser radiation, beam size, beam shape, pulse width, pulse fluence, pulse frequency, polarization, laser propagation direction relative to the semiconductor material, degree of coherence, etc. In one aspect, a laser can be configured to provide pulsatile lasing of a semiconductor material. A short-pulsed laser is one capable of producing femtosecond, picosecond and/or nanosecond pulse durations. Laser pulses can have a central wavelength in a range of about from about 10 nm to about 8 µm, and more specifically from about 200 nm to about 1200 nm. The pulse width of the laser radiation can be in a range of from about tens of femtoseconds to about hundreds of nanoseconds. In one aspect, laser pulse widths can be in the range of from about 5 femtoseconds to about 50 picoseconds. In another aspect, laser pulse widths can be in the range of from about 50 picoseconds to about 100 nanoseconds. In another aspect, laser pulse widths are in the range of from about 50 to about 500 femtoseconds. In yet another aspect, laser pulse widths are in the range of from about 5 femtoseconds to about 900 picoseconds.

The number of laser pulses irradiating a target region can be in a range of from about 1 to about 2000. In one aspect, the number of laser pulses irradiating a semiconductor target region can be from about 2 to about 1000. Further, the repetition rate or frequency of the pulses can be selected to be in a range of from about 10 Hz to about 10 µHz, or in a range of from about 1 kHz to about 1 MHz, or in a range from about 10 Hz to about 1 kHz. Moreover, the fluence of each laser pulse can be in a range of from about 1 kJ/m$^2$ to about 20 kJ/m$^2$, or in a range of from about 3 kJ/m$^2$ to about 8 kJ/m$^2$. The fluence of the laser is related to the size of the features in the textured region. On average, a lower laser fluence results in smaller features, while a higher laser fluence results in larger features. Other factors that can affect surface morphology include laser polarization and laser propagation direction relative to the irradiated semiconductor surface.

Further, the environment in which the semiconductor material is laser processed can have an effect on the size of the features. For example, lasing the semiconductor material in a liquid can create smaller features than lasing in gas. Other examples include lasing in a vacuum, in a chamber with a controlled gas, uncontrolled in open air, in open air with one or more gasses flowing over the surface, and the like. The process of lasing the semiconductor material in a liquid is described in U.S. patent application Ser. No. 12/038,209, filed on Feb. 27, 2008, which is incorporated herein by reference in its entirety.

As has been described, removing a portion of the semiconductor material having laser damage can improve the performance of the device. Removing this laser damage can be achieved via various techniques. It is noted that the particular technique of removing damaged material should not be seen as limiting, and all such techniques are considered to be within the present scope. Such techniques can include, for example, annealing the substrate after laser processing to a temperature of greater than 500° C. for a time duration of at least about 30 seconds. Other examples contemplated are, removing a portion of the semiconductor material that contains the majority of the defects via etching techniques. For instance, if crystalline defects are located in the first 300 nm of semiconductor material, a wet or dry etching step can be performed to remove this 300 nm damaged layer. Non-limiting examples of etching compounds can include hydrofluoric acid, nitric acid, hydrochloric acid, phosphoric acid, acetic acid, potassium hydroxide, sodium hydroxide, and the like, including other known acids and bases.

In another removal example, the defects may be removed by converting the damaged region to silicon dioxide and etching or stripping away the silicon dioxide layer with a hydrofluoric etch, thereby leaving the defect free monocrystalline material. Defects can also be removed by ablation, polishing, or the like.

It is important to note that the surface features or the surface topology is substantially maintained thereby preserving the anti-reflecting and light trapping properties of the device, as shown in FIG. 2. In one aspect, the resultant substantially defect free device can have a surface reflectance of less than about 25% for incident light having wavelengths in the range of about 500 nm to about 800 nm, without the aid of anti-reflective film. In another aspect, the resultant substantially defect free device can have a surface reflectance of less than about 20% for incident light having wavelengths in the range of about 500 nm to about 800 nm, without the aid of anti-reflective film. In yet another aspect, the resultant substantially defect free device can have a surface reflectance of less than about 10% for incident light having wavelengths in the range of about 500 nm to about 800 nm, without the aid of anti-reflective film. In a further aspect, the resultant substantially defect free device can have a surface reflectance of less than about 5% for incident light having wavelengths in the range of about 500 nm to about 800 nm, without the aid of anti-reflective film. In another aspect, the device can have a surface reflectance of less than or equal to about 5% for incident light having at least one wavelength in the range of about 300 nm to about 1200 nm. It should be noted, anti-reflective films can be disposed on at least one surface of the device and can further improve the anti-reflectance and in turn the efficiency can be improved.

In some aspects, a passivation layer, such as nitride for example, can be disposed over at least one surface of an optoelectronic device. Non-limiting examples of passivation materials can include nitrides, oxides, amorphous silicon, amorphous silicon carbide, and the like, including combinations thereof. In one specific aspect, the passivation region includes an oxide. Additionally, the passivation region can be of various thicknesses. In one aspect, for example, the passivation region has a thickness of from about 100 nm to about 1 µm. In another aspect, the passivation region has a thickness of from about 5 nm to about 100 nm. In yet another aspect, the passivation region has a thickness of from about 20 nm to about 50 nm. In one embodiment, the passivation region can be an anti-reflecting region.

It is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been described above with particularity and detail in connection with what is presently deemed to be the most practical embodiments of the disclosure, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. An optoelectronic device, comprising:
   a semiconductor material;
   a first doped region in the semiconductor material;

a second doped region in the semiconductor material forming a junction with the first doped region; and a laser processed region associated with the junction and configured to interact with electromagnetic radiation, wherein at least a portion of a region of laser damage from the laser processed region has been removed such that the optoelectronic device has an open circuit voltage of from about 500 mV to about 800 mV.

2. The device of claim 1, wherein laser damage from the laser processed region has been removed such that the optoelectronic device has an open circuit voltage of from about 600 mV to about 700 mV.

3. The device of claim 1, wherein the optoelectronic device has an internal quantum efficiency of from about 50% to about 100% for an electromagnetic radiation wavelength of 300 nm.

4. The device of claim 1, wherein the optoelectronic device has an internal quantum efficiency of from about 70% to about 100% for an electromagnetic radiation wavelength of 400 nm.

5. The device of claim 1, wherein laser damage from the laser processed region has been substantially removed.

6. The device of claim 1, wherein the semiconductor material includes a member selected from the group consisting of group IV materials, compounds and alloys comprising materials from groups II and VI, compounds and alloys comprising materials from groups III and V, and combinations thereof.

7. The device of claim 1, wherein the semiconductor material includes a member selected from the group consisting of Si, GaAs, Ge, CIGS, CdTe, and alloys and combinations thereof.

8. The device of claim 1, wherein the semiconductor material includes Si.

9. The device of claim 8, wherein the Si includes a member selected from the group consisting of monocrystalline, multicrystalline, microcrystalline, polycrystalline, and combinations thereof.

10. The device of claim 8, wherein the Si is multicrystalline.

11. The device of claim 1, wherein the laser processed region is adjacent to the first doped region.

12. The device of claim 1, wherein the first doped region is the laser processed region.

13. The device of claim 1, further comprising a dielectric layer disposed on the first doped region wherein the laser processed region is formed from the dielectric layer.

14. The device of claim 1, wherein the laser processed region includes surface features having a height selected from the group consisting of micron-sized, nano-sized, and combinations thereof.

15. The device of claim 14, wherein the surface features have a height of from about 5 nm to about 10 μm.

16. The device of claim 14, wherein the surface features have a height of from about 50 nm to about 2 μm.

17. The device of claim 14, wherein the surface features include a member selected from the group consisting of cones, pillars, pyramids, micro lenses, sphere-like structures, quantum dots, inverted features, and combinations thereof.

18. A semiconductor material, comprising:
a first region disposed adjacent to a second region, wherein the first region has a thickness in the range of about 100 nm to about 5 microns and includes a laser processed region that has undergone a laser damage removal process, and wherein the majority-carrier mobility and minority-carrier lifetime of the first region are at least about 50% the value of the second region, and wherein the first region and the second region have substantially the same doping levels.

19. The semiconductor material of claim 18, wherein the laser processed region has surface features following the laser damage removal process that have a height of from about 5 nm to about 10 μm.

20. The semiconductor material of claim 18, wherein the laser processed region has surface features following the laser damage removal process that have a height of from about 50 nm to about 2 μm.

21. The semiconductor material of claim 18, wherein the laser processed region has been formed via a pulsed laser having a pulse duration of from about 5 femtoseconds to about 900 picoseconds.

* * * * *